United States Patent
Li et al.

(10) Patent No.: US 11,764,553 B2
(45) Date of Patent: Sep. 19, 2023

(54) SMART POWER TRANSMISSION LINE INSPECTION SYSTEM

(71) Applicant: GUANGDONG KEYSTAR INTELLIGENCE ROBOT CO., LTD., Foshan (CN)

(72) Inventors: Fang Li, Foshan (CN); Shaochun Jia, Foshan (CN); Jixian Wu, Foshan (CN); Jiaju Xue, Foshan (CN); Yangyong Zhang, Foshan (CN); Guangmian Fan, Foshan (CN); Peng Ge, Foshan (CN)

(73) Assignee: GUANGDONG KEYSTAR INTELLIGENCE ROBOT CO., LTD., Foshan (CN)

( * ) Notice: Subject to any disclaimer, the term of this patent is extended or adjusted under 35 U.S.C. 154(b) by 197 days.

(21) Appl. No.: 17/426,214

(22) PCT Filed: Mar. 27, 2020

(86) PCT No.: PCT/CN2020/081751
§ 371 (c)(1),
(2) Date: Jul. 28, 2021

(87) PCT Pub. No.: WO2020/156590
PCT Pub. Date: Aug. 6, 2020

(65) Prior Publication Data
US 2022/0102948 A1    Mar. 31, 2022

(30) Foreign Application Priority Data

Jan. 28, 2019    (CN) .......................... 201910082151.9

(51) Int. Cl.
*H02G 1/02*    (2006.01)
*B60L 53/60*    (2019.01)
*G01R 31/58*    (2020.01)

(52) U.S. Cl.
CPC .............. *H02G 1/02* (2013.01); *B60L 53/60* (2019.02); *G01R 31/58* (2020.01)

(58) Field of Classification Search
CPC . H02G 1/02; B60L 53/60; B60L 50/60; B60L 2200/40; B60L 2240/62;
(Continued)

(56) References Cited

U.S. PATENT DOCUMENTS

| 8,666,553 | B2 * | 3/2014 | Phillips | ................. | B60K 16/00 |
| | | | | | 901/1 |
| 2011/0196536 | A1 * | 8/2011 | Phillips | .................... | H02G 1/02 |
| | | | | | 901/44 |

(Continued)

FOREIGN PATENT DOCUMENTS

| CN | 104269777 A | 1/2015 |
| CN | 107425463 A | 12/2017 |

(Continued)

OTHER PUBLICATIONS

Translated International Search Report and Non-Translated Written Opinion Form PCT/ISA/210 and PCT/ISA/237, International Application No. PCT/CN2020/081751, pp. 1-7, International Filing Date Mar. 27, 2020 search report dated Jul. 1, 2020.

*Primary Examiner* — Feba Pothen
(74) *Attorney, Agent, or Firm* — George McGuire

(57) ABSTRACT

A smart power transmission line inspection system, related to the technical field of robotic inspection. The smart power transmission line inspection system comprises an inspection robot, an activation/deactivation device, and a control and processing terminal. The activation/deactivation device is used for activating or deactivating the inspection robot according to an activation/deactivation instruction. The inspection robot is used for inspection along a power transmission line according to an inspection instruction, and the inspection robot is also used for obtaining inspection data
(Continued)

and for transmitting the inspection data to the control and processing terminal, wherein the inspection instruction is a pre-set inspection instruction pre-set for the inspection robot, or the inspection instruction is sent by the control and processing terminal and received by the inspection robot. The control and processing terminal is used for obtaining the status information of the power transmission line according to the inspection data. The smart power transmission line inspection system enables automatic inspection of a power transmission line by means of an inspection robot.

14 Claims, 5 Drawing Sheets

(58) Field of Classification Search
CPC ...... B60L 2260/32; B60L 53/51; B60L 53/52; B60L 53/53; G01R 31/58; Y02T 10/70; Y02T 10/7072; Y02T 90/12
See application file for complete search history.

(56) References Cited

U.S. PATENT DOCUMENTS

| | | | |
|---|---|---|---|
| 2012/0206098 A1* | 8/2012 | Kim | B60L 53/39 |
| | | | 320/108 |
| 2017/0285091 A1* | 10/2017 | Jiang | H02J 3/381 |
| 2017/0336806 A1* | 11/2017 | Blanc-Paques | G08G 5/045 |
| 2020/0074176 A1* | 3/2020 | Birchbauer | H02G 1/02 |

FOREIGN PATENT DOCUMENTS

| | | |
|---|---|---|
| CN | 107834427 A | 3/2018 |
| CN | 107947016 A | 4/2018 |
| CN | 109659859 A | 4/2019 |
| CN | 209233319 U | 8/2019 |
| JP | 2017131019 A | 7/2017 |

* cited by examiner

SMART POWER TRANSMISSION LINE INSPECTION SYSTEM

CROSS-REFERENCE TO RELATED APPLICATIONS

This is a National Stage Application, filed under 35 U.S.C. 371, of International Patent Application No. PCT/CN2020/081751, filed on Mar. 27, 2020. which application claims priority to Chinese Patent Application No. 201910082151.9. titled "SMART POWER TRANSMISSION LINE INSPECTION SYSTEM" and filed on Jan. 28, 2019, the entire contents of each of which are incorporated herein by reference.

TECHNICAL FIELD

The present disclosure relates to the field of robot patrol inspection technologies, and more particularly, to an intelligent patrol inspection system for a power transmission line.

BACKGROUND

As a special robot for device patrol inspection of power transmission lines, a patrol inspection robot can walk along earth wires of high-voltage and extra-high voltage power transmission lines, to carry out patrol inspection and fault analysis on the power transmission lines through a variety of detection devices arranged on the patrol inspection robot. Existing systems for carrying out patrol inspection on the power transmission lines by using the patrol inspection robot still have defects in patrol inspection of the patrol inspection robot, for example, how to get-on/off a line for the patrol inspection robot. Applicants have been engaged in research and development of related technologies for a long time. The present disclosure aims to provide a more convenient and intelligent system having a better patrol inspection effect.

SUMMARY

An objective of the present disclosure includes providing an intelligent patrol inspection system for a power transmission line, which can facilitate automatic patrol inspection of the power transmission line by means of a patrol inspection robot.

The present disclosure provides technical solutions with regards to an intelligent patrol inspection system for a power transmission line.

An embodiment of the present disclosure provides an intelligent patrol inspection system for a power transmission line, which is configured to perform patrol inspection on a power transmission line. The intelligent patrol inspection system for a power transmission line includes a patrol inspection robot, a line get-on/off apparatus, and a control processing terminal. Both the patrol inspection robot and the line get-on/off apparatus are communicatively connected to the control processing terminal. The line get-on/off apparatus is configured to instruct the patrol inspection robot to get on or off a line according to a line get-on/off instruction, wherein the line get-on/off instruction is a line get-on/off preset instruction preset by the line get-on/off apparatus, or the line get-on/off instruction is issued from the control processing terminal and is received by the line get-on/off apparatus. The patrol inspection robot is configured to perform patrol inspection along the power transmission line according to a patrol inspection instruction, and the patrol inspection robot is also configured to obtain patrol inspection data and transmit the patrol inspection data to the control processing terminal, wherein the patrol inspection instruction is a patrol inspection preset instruction preset by the patrol inspection robot, or the patrol inspection instruction is issued from the control processing terminal and is received by the patrol inspection robot. The control processing terminal is configured to obtain state information of the power transmission line according to the patrol inspection data.

Alternatively, the patrol inspection robot includes a robot body, a battery module, a power module, a patrol inspection module, and a patrol inspection communication module. The battery module, the power module, the patrol inspection module and the patrol inspection communication module are all arranged in the robot body. The power module, the patrol inspection module and the patrol inspection communication module are all electrically connected to the battery module. The power module is configured to drive the robot body to move along the line get-on/off apparatus or the power transmission line. The patrol inspection module is configured to obtain the patrol inspection data, the patrol inspection communication module is configured to transmit the patrol inspection data to the control processing terminal, and the patrol inspection communication module is also configured to receive the patrol inspection instruction.

Alternatively, the patrol inspection module includes a visible-light camera and a laser radar. The patrol inspection data include patrol data and line data. The visible-light camera is configured to obtain the patrol data, the laser radar is configured to obtain the line data, and the patrol inspection communication module is also configured to transmit the patrol data and the line data to the control processing terminal.

Alternatively, the patrol inspection robot is also configured to obtain a power transmission line corridor picture and three-dimensional point cloud data through the laser radar, and to transmit the three-dimensional point cloud data to the control processing terminal, such that a line corridor three-dimensional model is formed by data post-processing and analysis.

Alternatively, the patrol inspection robot is provided with a high definition camera.

Alternatively, the patrol inspection module also includes an infrared thermal imager, an ultraviolet imager and/or an ultrasonic detector. The infrared thermal imager is configured to detect temperature information of a joint of the power transmission line and transmit the temperature information to the control processing terminal. The ultraviolet imager is configured to detect flashover information of an insulator and transmit the flashover information to the control processing terminal, wherein the insulator is arranged on the power transmission line. The ultrasonic detector is configured to detect partial discharge information of the insulator and transmit the partial discharge information to the control processing terminal.

Alternatively, the intelligent patrol inspection system for a power transmission line also includes a charging base station, wherein the charging base station is arranged along the power transmission line and is communicatively connected to the control processing terminal. The charging base station can be electrically connected to the battery module to charge the battery module.

Alternatively, there are provided with a plurality of the charging base stations spaced apart at certain intervals, and a distance between two adjacent charging base stations ranges from 8 kilometers to 12 kilometers. The battery module of the patrol inspection robot is arranged according to the distance between the two adjacent charging base stations to ensure that the patrol inspection robot has enough power to reach a next charging base station.

Alternatively, the charging base station includes a solar panel, an accumulator battery, and a charging communication module. The solar panel is electrically connected to the accumulator battery, the charging communication module is electrically connected to the accumulator battery, the charging communication module is communicatively connected to the control processing terminal, and the charging base station can be electrically connected to the battery module to charge the battery module.

Alternatively, the charging base station includes a wind power generation device, an accumulator battery, and a charging communication module. The wind power generation device is electrically connected to the accumulator battery, the charging communication module is electrically connected to the accumulator battery, the charging communication module is communicatively connected to the control processing terminal, and the charging base station can be electrically connected to the battery module to charge the battery module. Alternatively, the intelligent patrol inspection system for a power transmission line also includes a communication base station. The line get-on/off apparatus and the patrol inspection robot are communicatively connected to the control processing terminal through the communication base station. The control processing terminal communicates with the communication base station via wired communication and/or wireless communication.

Alternatively, the line get-on/off apparatus includes a line get-on/off rail, a climbing assembly, and a carrying assembly. The line get-on/off rail is arranged on an iron tower. The climbing assembly includes a drive device and a rotation gear, wherein the drive device is mounted on the carrying assembly and is drive-connected to the rotation gear. The carrying assembly is provided with carrying space. The rotation gear fits with the line get-on/off rail to drive the carrying assembly to move along the line get-on/off rail.

Alternatively, the intelligent patrol inspection system for a power transmission line also includes a bridging apparatus, wherein the bridging apparatus includes a guide rail assembly, a connection assembly, and a mounting assembly. The guide rail assembly includes a flexible guide rail and a bridging pipe, the mounting assembly includes a mounting element and a fixing element, and the fixing element is detachably connected to the mounting element. The bridging pipe is connected to the mounting element, the mounting element is configured to fixedly connect the iron tower, and the flexible guide rail is connected to the bridging pipe through the fixing element and the mounting element. An end of the flexible guide rail away from the bridging pipe is arranged on the power transmission line by means of the connection assembly, wherein the power transmission line is connected to the iron tower.

Alternatively, the mounting assembly is configured to mount the guide rail assembly on pole and tower, the connection assembly is configured to connect the guide rail assembly to the power transmission line, and the guide rail assembly is configured to facilitate the patrol inspection robot to move. In the mounting assembly, the mounting element is fixed to the pole and tower, the fixing element is configured to fix the flexible guide rail to the mounting element, and the fixing element is detachably connected to the mounting element, such that the flexible guide rail is adjustable in length.

Alternatively, the bridging apparatus also includes a charging dock, the charging dock is fixedly connected to the mounting element, and the charging dock is configured to charge the patrol inspection robot.

BRIEF DESCRIPTION OF THE DRAWINGS

To describe the technical solutions of the embodiments of the present disclosure more clearly, the accompanying drawings required for describing the embodiments will be briefly introduced below. It is to be appreciated that the following accompanying drawings merely illustrate some embodiments of the present disclosure, and thus should not be regarded as limiting the scope of the present disclosure. To those of ordinary skills in the art, other related accompanying drawings may also be derived from these accompanying drawings without creative efforts.

Figure 1:
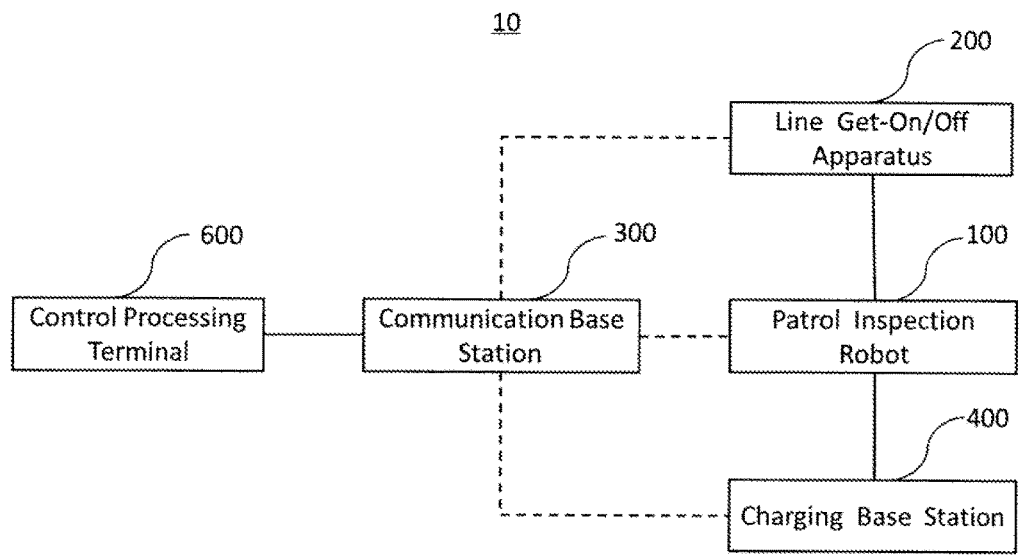
FIG. 1 is a structural block diagram of an intelligent patrol inspection system for a power transmission line according to an embodiment of the present disclosure.

Reference numerals in the accompanying drawings: 10-intelligent patrol inspection system for a power transmission line; 100-patrol inspection robot; 110-robot body; 120-battery module; 130-power module; 140-patrol inspection module; 150-patrol inspection communication module; 200-line get-on/off apparatus; 210-line get-on/off rail; 220-climbing assembly; 221-drive device; 223-rotation gear; 230-carrying assembly; 300-communication base station; 400-charging base station; 500-bridging apparatus; 510-guide rail assembly; 511-flexible guide rail; 512-bridging pipe; 520-connection assembly; 530-mounting assembly; 531-mounting element; 532-fixing element; 540-charging dock; and 600-control processing terminal.

DETAILED DESCRIPTION

To make the objectives, technical solutions, and advantages of the present disclosure clearer, the technical solutions of the embodiments of the present disclosure will be described clearly and completely below with reference to the accompanying drawings in the embodiments of the present disclosure. Apparently, the described embodiments are some but not all of the embodiments of the present disclosure. Assemblies of the embodiments of the present disclosure, as generally described and illustrated in the accompanying drawings herein, may be arranged and designed in a wide variety of different configurations.

Thus, the following detailed description of the embodiments of the present disclosure, as provided in the accompanying drawings, is not intended to limit the scope of the present disclosure as claimed, but is merely representative of selected embodiments of the present disclosure. All other embodiments obtained by a person of ordinary skill in the art based on the embodiments of the present disclosure without creative efforts shall fall within the protection scope of the present disclosure.

It is to be noted that similar reference numerals and letters indicate similar items in the following accompanying drawings. Therefore, once an item is defined in one drawing, there is no need to define and explain this item further in subsequent drawings.

In the description of the present disclosure, it is to be understood that the orientations or positional relationships represented by the terms such as "up", "down", "inner", "outer", "left", "right" and the like are based on the orientations or positional relationships as shown in the accompanying drawings, or are customary orientations or positional relationships when the products applied are in use, or are orientations or positional relationships conventionally understood by those skilled in the art. These orientations or positional relationships are merely for ease of a description of the present disclosure and a simplified description instead of being intended to indicate or imply the device or component to have a special orientation or to be configured and operated in a special orientation. Thus, these orientations or positional relationships cannot be understood as limitations on the present disclosure.

In addition, in the present disclosure, terms such as "first" and "second" are merely for distinguishing description, and are not construed as indicating or implying relative importance.

In the description of the present disclosure, it is to be noted that unless specified or limited otherwise, terms such as "arranged", and "connection" should be understood in a broad sense. For example, the "connection" may be a fixed connection, a detachable connection or integrated connection, a mechanical connection or an electrical connection, a direct connection or indirect connection by means of an intermediary, or internal communication between two components. For those of ordinary skill in the art, specific meanings of the above terms in the present disclosure may be understood based on specific circumstances.

Specific embodiments of the present disclosure are described in detail below with reference to the accompanying drawing.

With reference to FIG. 1, this embodiment provides an intelligent patrol inspection system 10 for a power transmission line, which can facilitate automatic patrol inspection of the power transmission line by means of a patrol inspection robot 100.

It is to be noted that the intelligent patrol inspection system 10 for a power transmission line provided in this embodiment can a perform a patrol inspection on the power transmission line through the patrol inspection robot 100, thereby reducing manpower input and potential safety hazards.

The intelligent patrol inspection system 10 for a power transmission line provided in this embodiment includes the patrol inspection robot 100, a line get-on/off apparatus 200, and a control processing terminal 600. Both the patrol inspection robot 100 and the line get-on/off apparatus 200 are communicatively connected to the control processing terminal 600. The line get-on/off apparatus 200 is configured to instruct the patrol inspection robot 100 to get on or off a line according to a line get-on/off instruction, wherein the line get-on/off instruction is a line get-on/off preset instruction preset by the line get-on/off apparatus 200, or the line get-on/off instruction is issued from the control processing terminal 600 and is received by the line get-on/off apparatus 200. The patrol inspection robot 100 is configured to perform patrol inspection along the power transmission line according to a patrol inspection instruction, and the patrol inspection robot 100 is also configured to obtain patrol inspection data and transmit the patrol inspection data to the control processing terminal 600, wherein the patrol inspection instruction is a patrol inspection preset instruction preset by the patrol inspection robot 100, or the patrol inspection instruction is issued from the control processing terminal 600 and is received by the patrol inspection robot 100. The control processing terminal 600 is configured to obtain state information of the power transmission line according to the patrol inspection data.

The "getting on a line" herein refers to a process of the patrol inspection robot traveling from a predetermined starting position (such as ground) to an earth wire (also called lightning wire) at a predetermined height position of a power transmission infrastructure (such as a tower or pole and tower) to carry out an operation. The "getting off a line" herein refers to a process of the patrol inspection robot traveling from an operation position of the power transmission infrastructure (such as the tower or pole and tower) to a standby position (such as the ground). It is to be noted that "on" and "off" here refer to abstract meanings, and do not mean that in the process of getting on a line the height of the patrol inspection robot is increased or that in the process of getting off the line the height of the patrol inspection robot is decreased. Based on requirements of actual application scenarios, the patrol inspection robot may also descend from a higher initial standby position to a predetermined position at a lower height and start operation.

Figure 2:
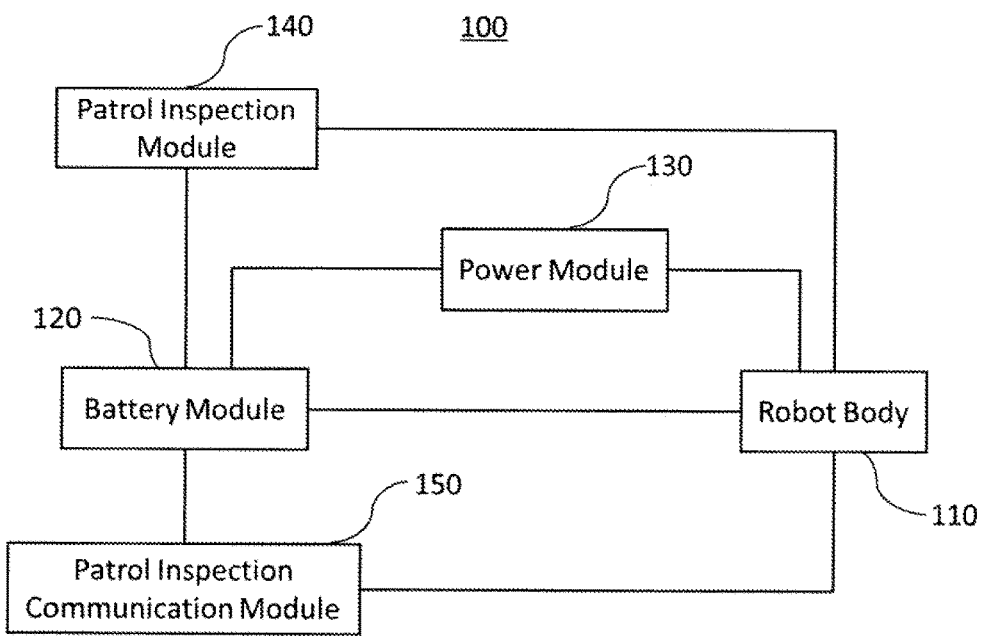
FIG. 2 is a structural block diagram of a patrol inspection robot according to an embodiment of the present disclosure.

Alternatively, with reference to FIG. 2, in this embodiment, the patrol inspection robot 100 includes a robot body 110, a battery module 120, a power module 130, a patrol inspection module 140, and a patrol inspection communication module 150. The battery module 120, the power module 130, the patrol inspection module 140 and the patrol inspection communication module 150 are all arranged in the robot body 110. The power module 130, the patrol inspection module 140 and the patrol inspection communication module 150 are all electrically connected to the battery module 120. The power module 130 is configured to drive the robot body 110 to move along the line get-on/off apparatus 200 or the power transmission line. The patrol inspection module 140 is configured to obtain the patrol inspection data, the patrol inspection communication module 150 is configured to transmit the patrol inspection data to the control processing terminal 600, and the patrol inspection communication module 150 is also configured to receive the patrol inspection instruction.

Alternatively, the patrol inspection module 140 may include a visible-light camera and a laser radar. The patrol inspection data include patrol data and line data. The visible-light camera is configured to obtain the patrol data, the laser radar is configured to obtain the line data, and the patrol inspection communication module 150 is also configured to transmit the line data to the control processing terminal 600.

It is to be noted that the patrol inspection robot 100 may obtain a power transmission line corridor picture and three-dimensional point cloud data through the laser radar. After the three-dimensional point cloud data are transmitted to the control processing terminal 600, a line corridor three-dimensional model may be formed by data post-processing and analysis. In the three-dimensional model, types of objects such as power lines, poles and towers, ground points and vegetations may be classified using image recognition algorithms; a conductor sag, a distance between conductors and a distance between a conductor and another object may be calculated; and a sag measurement, a cross-span measurement and a tree obstacle hidden danger analysis may be made. The visible-light camera can realize a patrol inspection of a main body and a patrol inspection of channel environments, and the above two patrol inspections may be carried out simultaneously or separately. The patrol inspection of the main body refers to the patrol inspection of various infrastructures (such as poles and towers, earth conductors, metal fittings, etc.) of the main body of the power transmission line. The patrol inspection of the channel environments only refers to the patrol inspection of lower corridor environments of paths where the power transmission line is erected, for example, a safety distance between conductors and other objects such as buildings, trees, and railways, etc. Alternatively, the patrol inspection robot 100 also may be provided with a high definition camera, which can complete refined live-line inspection tasks in place of manual labor of inspection personnel, thereby reducing manpower and avoiding hidden safety hazards in the inspection.

Alternatively, the patrol inspection module 140 also includes an infrared thermal imager, an ultraviolet imager and/or an ultrasonic detector. The infrared thermal imager is configured to detect temperature information of a joint of the power transmission line and transmit the temperature information to the control processing terminal 600. The ultraviolet imager is configured to detect flashover information of an insulator and transmit the flashover information to the control processing terminal 600, wherein the insulator is arranged on the power transmission line. The ultrasonic detector is configured to detect partial discharge information of the insulator and transmit the partial discharge information to the control processing terminal 600.

It is to be noted that the patrol inspection module 140 may include any one of the infrared thermal imager, the ultraviolet imager and the ultrasonic detector, or any combination of the infrared thermal imager, the ultraviolet imager, and the ultrasonic detector. In addition, the infrared thermal imager, the ultraviolet imager and the ultrasonic detector may separately communicate with the control processing terminal 600, or may communicate with the control processing terminal 600 through the patrol inspection communication module 150. The communication between the patrol inspection communication module 150 and the control processing terminal 600 may be wired communication or wireless communication, or combination of the wired communication and wireless communication and are mutually backed up, to increase safety redundancy of the system.

Alternatively, with reference to FIG. 1, in this embodiment, the intelligent patrol inspection system 10 for a power transmission line may also include a communication base station 300. The line get-on/off apparatus 200 and the patrol inspection robot 100 are communicatively connected to the control processing terminal 600 through the communication base station 300. The control processing terminal 600 communicates with the communication base station 300 via wired communication and/or wireless communication. The communication base station 300 may also be a mobile communication base station erected by an existing network operator, such as a 4G/5G base station, etc. In this case, the patrol inspection robot 100 is configured to perform wireless communication with the control processing terminal 600 through network services provided by the network operator. In this way, deployment costs of this system can be effectively reduced, especially in urban areas and other areas with better operator signal coverage.

Alternatively, in this embodiment, the intelligent patrol inspection system 10 for a power transmission line may also include a charging base station 400, wherein the charging base station 400 is arranged along the power transmission line and is communicatively connected to the control processing terminal 600. The charging base station 400 can be electrically connected to the battery module 120 to charge the battery module 120.

It is to be noted that the charging base station 400 is configured to supply power to the patrol inspection robot 100 to ensure normal operation of the patrol inspection and a longer patrol inspection distance. Alternatively, a plurality of the charging base stations 400 may be spaced apart at certain intervals, and a distance between two adjacent charging base stations 400 may range from 8 kilometers to 12 kilometers, or the charging base stations 400 may be spaced at other intervals. It is to be noted that this distance is only an alternative solution here. In practice, this distance may also be adjusted according to actual situations and requirements of the line. For example, the distance between two adjacent charging base stations 400 may also be set as 4-5 kilometers. In addition, the distance between two adjacent charging base stations 400 may be flexibly configured according to local geographic and geomorphic conditions. For example, in plain areas, this distance generally is set as 8-12 kilometers, and in mountainous areas, this distance may be set as 4-5 kilometers. The battery module 120 of the patrol inspection robot 100 may be arranged according to the distance between two adjacent charging base stations 400 to ensure that the patrol inspection robot 100 has enough power to reach a next charging base station 400.

Alternatively, the patrol inspection robot 100 may pre-store distance and position information of each charging base station, such that the patrol inspection robot 100 can calculate an alarm power threshold corresponding to endurance time for safe operation based on remaining power of the battery module 120 of the patrol inspection robot 100 and a position of the nearest charging base station 400, and promptly remind an operator, or automatically leave for the nearest charging base station 400 for charging when the remaining power drops to the alarm power threshold. Alternatively, the operator may also update the position information of the charging base station 400 for the patrol inspection robot 100 in real time through the patrol inspection communication module 150 by using the control processing terminal 600.

Alternatively, the charging base station 400 includes a solar panel, an accumulator battery, and a charging communication module. The solar panel is electrically connected to the accumulator battery, the charging communication module is electrically connected to the accumulator battery, the charging communication module is communicatively connected to the control processing terminal 600, and the battery module 120 can be electrically connected to the battery module 120 and is configured to charge the battery module 120.

Alternatively, when the communication base station 300 is not a base station provided directly by a civil network service provider, but is a base station using a dedicated power communication network, the communication base station 300 and the charging base station 400 may be integrated together. That is, in addition to charging the battery module 120, the charging base station 400 also provides power to maintain operation of a set of communication device. This solution can make the entire system structure simpler, making the system suitable for remote areas and other application scenarios with poor signal coverage.

In addition, when the charging base station 400 is arranged, a wind power generation device and other devices utilizing natural energy resources to generate power may be arranged to ensure sufficient power supply.

Figure 6:
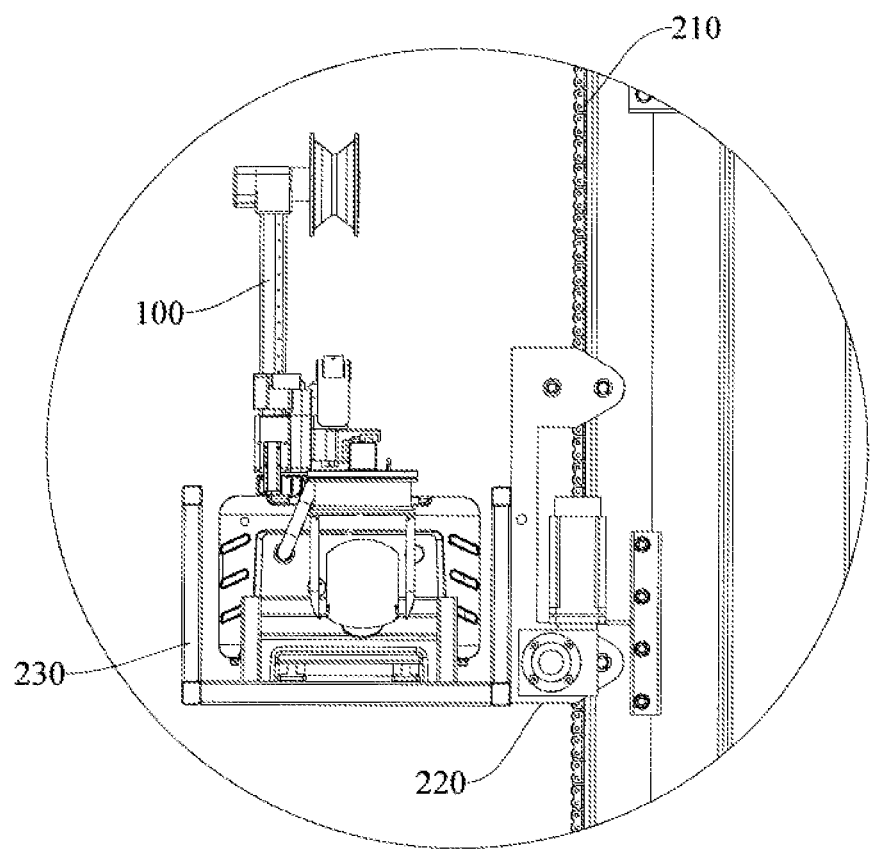
FIG. 6 is a schematic structural diagram of a patrol inspection robot positioned on a line get-on/off apparatus according to an embodiment of the present disclosure.
Figure 7:
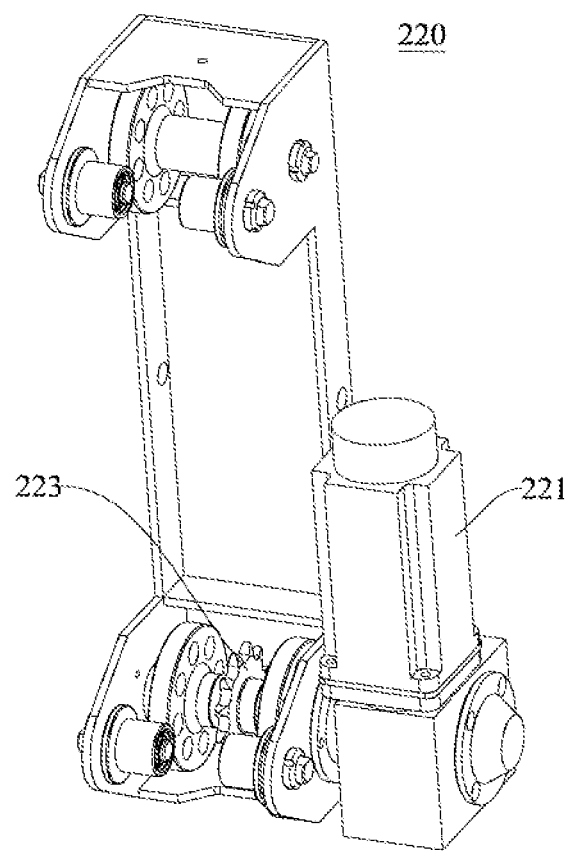
FIG. 7 is a schematic structural diagram of a climbing assembly according to embodiments of the present disclosure.

Alternatively, with reference to FIG. 6 and FIG. 7, the line get-on/off apparatus 200 includes a line get-on/off rail 210, a climbing assembly 220, and a carrying assembly 230. The line get-on/off rail 210 is arranged on a power infrastructure (such as an iron tower). The climbing assembly 220 includes a drive device 221 and a rotation gear 223, wherein the drive device 221 is mounted on the carrying assembly 230 and is drive-connected to the rotation gear 223. The carrying assembly 230 is provided with carrying space. The rotation gear 223 fits with the line get-on/off rail 210 to drive the carrying assembly 230 to move along the line get-on/off rail 210. When getting on/off a line, the carrying space carries the patrol inspection robot 100 to complete the action of getting on/off the line for the patrol inspection robot 100.

It is to be understood that the carrying assembly 230 is configured to fix the patrol inspection robot 100, the climbing assembly 220 is configured to drive the carrying assembly 230 and the patrol inspection robot 100 in the carrying assembly 230 to move with respect to the line get-on/off rail 210, and the line get-on/off rail 210 is configured to connect upper and lower ends of an iron tower body of the iron tower of the power transmission line. When the climbing assembly 220 moves along the line get-on/off rail 210, the climbing assembly 220 and the patrol inspection robot 100 move up and down with respect to the iron tower body. The carrying space is configured to carry the patrol inspection robot 100, the drive device 221 is configured to provide power to get on/off the line for the patrol inspection robot 100, and the rotation gear 223 fits with the line get-on/off rail 210 to drive the rotation gear 223 to move with respect to the line get-on/off rail 210 when the drive device 221 is running, such that the patrol inspection robot 100 can get on/off the line. The line get-on/off apparatus 200 can effectively improve efficiency of getting on/off the line, avoid risks of manual operation, and also can avoid line tripping and reduce safety risks.

Figure 3:
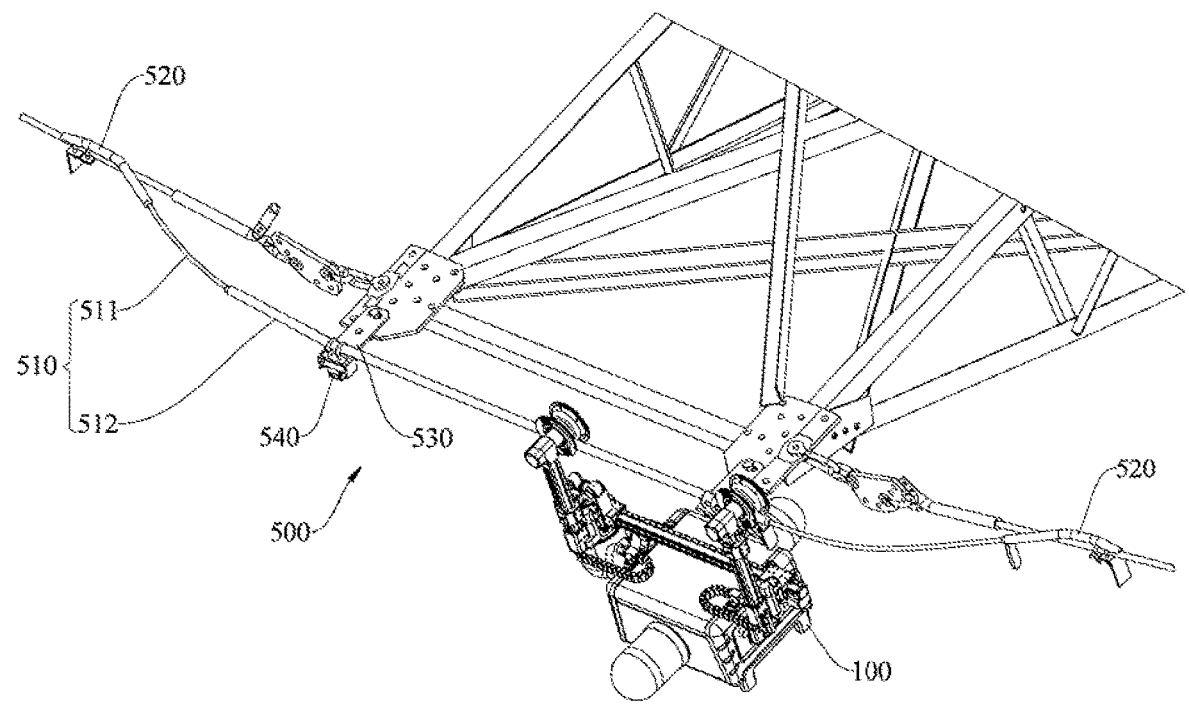
FIG. 3 is a schematic structural diagram of a bridging apparatus according to an embodiment of the present disclosure.
Figure 4:
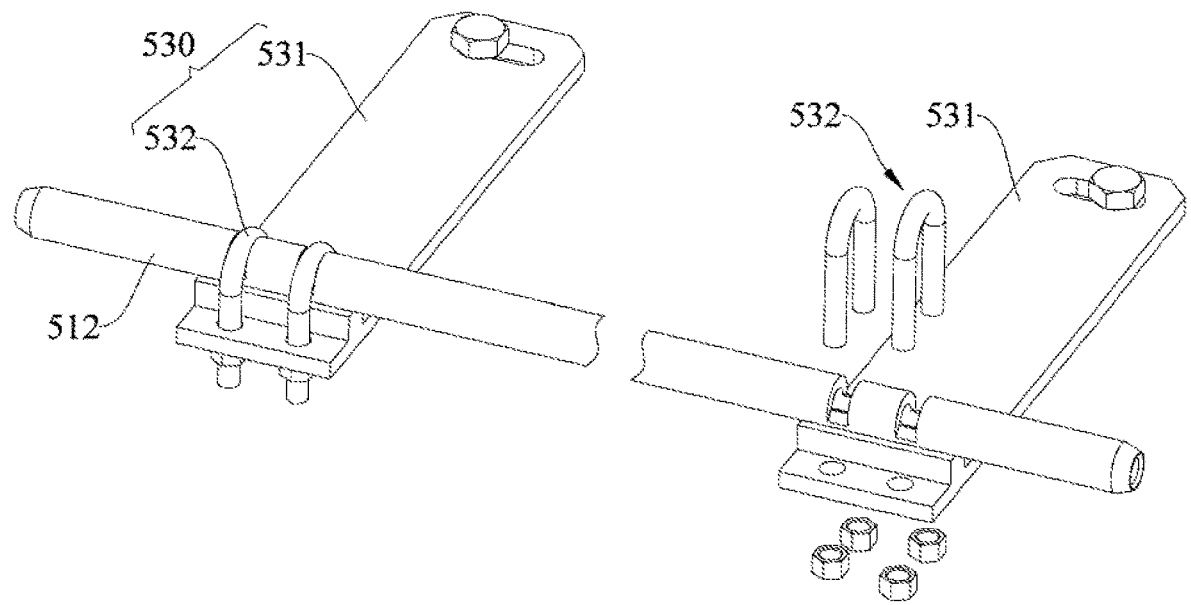
FIG. 4 is a schematic structural diagram of a mounting assembly according to an embodiment of the present disclosure.
Figure 5:
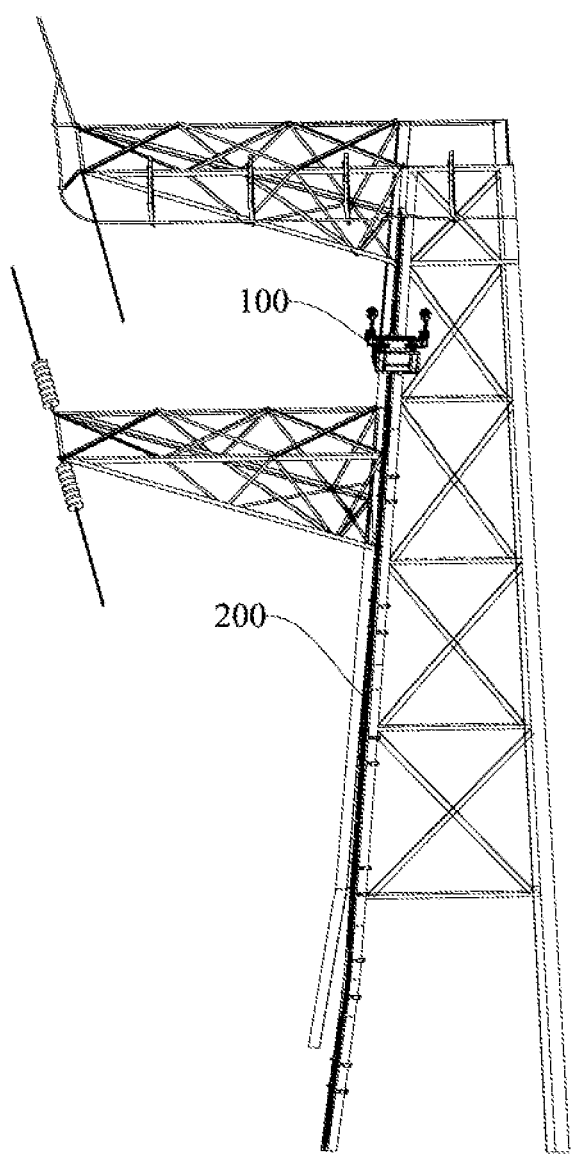
FIG. 5 is a schematic structural diagram showing installation of a line get-on/off apparatus according to an embodiment of the present disclosure.

Alternatively, with reference to FIG. 3, the intelligent patrol inspection system 10 for a power transmission line also includes a bridging apparatus 500. The bridging apparatus 500 includes a guide rail assembly 510, a connection assembly 520, and a mounting assembly 530. The guide rail assembly 510 includes a flexible guide rail 511 and a bridging pipe 512, the mounting assembly 530 includes a mounting element 531 and a fixing element 532, and the fixing element 532 is detachably connected to the mounting element 531. The bridging pipe 512 is connected to the mounting element 531, the mounting element 531 is configured to fixedly connect the iron tower, and the flexible guide rail 511 is connected to the bridging pipe 512 through the fixing element 532 and the mounting element 531. An end of the flexible guide rail 511 away from the bridging pipe 512 is arranged on the power transmission line by means of the connection assembly 520, wherein the power transmission line is connected to the iron tower.

It is to be understood that the mounting assembly 530 is configured to mount the guide rail assembly 510 on pole and tower, the connection assembly 520 is configured to connect the guide rail assembly 510 to the power transmission line, and the guide rail assembly 510 is configured to facilitate the patrol inspection robot 100 to move. In the mounting assembly 530, the mounting element 531 is fixed to the pole and tower, the fixing element 532 is configured to fix the flexible guide rail 511 to the mounting element 531, and the fixing element 532 is detachably connected to the mounting element 531, such that the flexible guide rail 511 is adjustable in length, to fit to poles and towers of different sizes and types. The bridging apparatus 500 is simple in structure and convenient for construction, and can conveniently adjust a length of the flexible guide rail 511 to fit to the poles and towers of different sizes and types. The "bridging" herein refers to an auxiliary guide rail facilitating the robot to get across an obstacle in the line such as the pole and tower or a suspension clamp, such that the robot can continuously walk along the entire power transmission line. The bridging apparatus 500 generally is mounted on an earth wire peak of the pole and tower or a joint between the pole and tower and an earth wire.

In addition to providing the charging base stations 400 spaced apart at certain intervals, in an alternative embodiment of the present disclosure, the bridging apparatus 500 may further include a charging dock 540. The charging dock 540 is fixedly connected to the mounting element 531, and the charging dock 540 is configured to charge the patrol inspection robot 100.

The above embodiments are merely alternative embodiments of the present disclosure and are not intended to limit the present disclosure. To those skilled in the art, the present disclosure may have various modifications and changes. All modifications, equivalent substitutions and improvements made within the spirit and principle of the present disclosure shall fall within the protection scope of the present disclosure.

PRACTICAL APPLICABILITY

An embodiment of the present disclosure provides an intelligent patrol inspection system for a power transmission line, which can achieve a technical effect of facilitating automatic patrol inspection of the power transmission line by means of a patrol inspection robot.

What is claimed is:

1. An intelligent patrol inspection system for a power transmission line being configured to perform patrol inspection on a power transmission line, the intelligent patrol inspection system comprising a patrol inspection robot, a line get-on/off apparatus, and a control processing terminal, both the patrol inspection robot and the line get-on/off apparatus being communicatively connected to the control processing terminal;

the line get-on/off apparatus being configured to instruct the patrol inspection robot to get on or off a line according to a line get-on/off instruction, wherein the patrol inspection robot to get on a line refers to a process of the patrol inspection robot traveling through the line get-on/off apparatus from a predetermined starting position to an earth wire at a predetermined height position of a power transmission infrastructure to carry out an operation, wherein the line get-on/off instruction is a line get-on/off preset instruction preset by the line get-on/off apparatus, or the line get-on/off instruction is issued from the control processing terminal and is received by the line get-on/off apparatus, wherein the line get-on/off apparatus comprises a line get-on/off rail, a climbing assembly, and a carrying assembly, the line get-on/off rail being arranged on an iron tower of the power transmission infrastructure, the climbing assembly comprising a drive device and a rotation gear, the drive device being mounted on the carrying assembly and drive-connected to the rotation gear, the carrying assembly being provided with carrying space for the patrol inspection robot, the rotation gear fitting with the line get-on/off rail to drive the carrying assembly to move along the line get-on/off rail;

the patrol inspection robot being configured to perform patrol inspection in a manner of walking along the earth wire of the power transmission line according to a patrol inspection instruction, and the patrol inspection robot being further configured to obtain patrol inspection data and transmit the patrol inspection data to the control processing terminal, wherein the patrol inspection instruction is a patrol inspection preset instruction preset by the patrol inspection robot, or the patrol inspection instruction is issued from the control processing terminal and is received by the patrol inspection robot; and the control processing terminal being configured to obtain state information of the power transmission line according to the patrol inspection data.

2. The intelligent patrol inspection system for a power transmission line according to claim 1, wherein the patrol inspection robot comprises a robot body, a battery module, a power module, a patrol inspection module, and a patrol inspection communication module;

wherein the battery module, the power module, the patrol inspection module and the patrol inspection communication module are all arranged in the robot body, and the power module, the patrol inspection module and the patrol inspection communication module are all electrically connected to the battery module;

wherein the power module is configured to drive the robot body to move along the line get-on/off apparatus or the power transmission line; and wherein the patrol inspection module is configured to obtain the patrol inspection data, the patrol inspection communication module is configured to transmit the patrol inspection data to the control processing terminal, and the patrol inspection communication module is further configured to receive the patrol inspection instruction.

3. The intelligent patrol inspection system for a power transmission line according to claim 2, wherein the patrol inspection module comprises a visible-light camera and a laser radar, the patrol inspection data comprising patrol data and line data, the visible-light camera being configured to obtain the patrol data, the laser radar being configured to obtain the line data, and the patrol inspection communication module being further configured to transmit the patrol data and the line data to the control processing terminal.

4. The intelligent patrol inspection system for a power transmission line according to claim 3, wherein the patrol inspection robot is further configured to obtain a power transmission line corridor picture and three-dimensional point cloud data through the laser radar, and to transmit the three-dimensional point cloud data to the control processing terminal, such that a line corridor three-dimensional model is formed by data post-processing and analysis.

5. The intelligent patrol inspection system for a power transmission line according to any one of claims 2 to 4, wherein the patrol inspection robot is provided with a high definition camera.

6. The intelligent patrol inspection system for a power transmission line according to any one of claims 2 to 5, wherein the patrol inspection module further comprises an infrared thermal imager, an ultraviolet imager and/or an ultrasonic detector; the infrared thermal imager being configured to detect temperature information of a joint of the power transmission line and transmit the temperature information to the control processing terminal; the ultraviolet imager being configured to detect flashover information of an insulator and transmit the flashover information to the control processing terminal, wherein the insulator is arranged on the power transmission line; the ultrasonic detector being configured to detect partial discharge information of the insulator and transmit the partial discharge information to the control processing terminal.

7. The intelligent patrol inspection system for a power transmission line according to any one of claims 2 to 6, further comprising a charging base station, wherein the charging base station is arranged along the power transmission line and is communicatively connected to the control processing terminal, and the charging base station is electrically connected to the battery module to charge the battery module.

8. The intelligent patrol inspection system for a power transmission line according to claim 7, wherein there are provided with a plurality of the charging base stations spaced apart at certain intervals, and a distance between two adjacent charging base stations ranges from 8 kilometers to 12 kilometers; and the battery module of the patrol inspection robot is arranged according to the distance between the two adjacent charging base stations to ensure that the patrol inspection robot has enough power to reach a next charging base station.

9. The intelligent patrol inspection system for a power transmission line according to claim 7 or 8, wherein the charging base station comprises a solar panel, an accumulator battery, and a charging communication module, the solar panel being electrically connected to the accumulator battery, the charging communication module being electrically connected to the accumulator battery, the charging communication module being communicatively connected to the control processing terminal, and the charging base station being electrically connected to the battery module and configured to charge the battery module.

10. The intelligent patrol inspection system for a power transmission line according to claim 7 or 8, wherein the charging base station comprises a wind power generation device, an accumulator battery, and a charging communication module, the wind power generation device being electrically connected to the accumulator battery, the charging communication module being electrically connected to the accumulator battery, the charging communication module being communicatively connected to the control processing terminal, and the charging base station being electrically connected to the battery module and configured to charge the battery module.

11. The intelligent patrol inspection system for a power transmission line according to any one of claims 1 to 10, further comprising a communication base station, wherein the line get-on/off apparatus and the patrol inspection robot are communicatively connected to the control processing terminal through the communication base station; and the control processing terminal communicates with the communication base station via wired communication and/or wireless communication.

12. The intelligent patrol inspection system for a power transmission line according to any one of claims 1 to 11, further comprising a bridging apparatus, wherein the bridging apparatus comprises a guide rail assembly, a connection assembly, and a mounting assembly, the guide rail assembly comprising a flexible guide rail and a bridging pipe, the mounting assembly comprising a mounting element and a fixing element, the fixing element being detachably connected to the mounting element, the bridging pipe being connected to the mounting element, the mounting element being configured to fixedly connect the iron tower, the flexible guide rail being connected to the bridging pipe through the fixing element and the mounting element, and an end of the flexible guide rail away from the bridging pipe being arranged on the power transmission line by means of the connection assembly, wherein the power transmission line is connected to the iron tower.

13. The intelligent patrol inspection system for a power transmission line according to claim 12, wherein the mounting assembly is configured to mount the guide rail assembly on pole and tower, the connection assembly being configured to connect the guide rail assembly to the power transmission line, and the guide rail assembly being configured to facilitate the patrol inspection robot to move; and wherein in the mounting assembly, the mounting element is fixed to the pole and tower, the fixing element being configured to fix the flexible guide rail to the mounting element, and the fixing element being detachably connected to the mounting element, such that the flexible guide rail is adjustable in length.

14. The intelligent patrol inspection system for a power transmission line according to claim 12 or 13, wherein the bridging apparatus further comprises a charging dock, the charging dock being fixedly connected to the mounting element, and the charging dock being configured to charge the patrol inspection robot.

\* \* \* \* \*